United States Patent
Gabrani et al.

(10) Patent No.: US 10,216,889 B2
(45) Date of Patent: *Feb. 26, 2019

(54) IC LAYOUT PATTERN MATCHING AND CLASSIFICATION SYSTEM AND METHOD

(71) Applicant: INTERNATIONAL BUSINESS MACHINES CORPORATION, Armonk, NY (US)

(72) Inventors: Maria Gabrani, Thalwil (CH); Paul T. Hurley, Oberrieden (CH)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 15/222,719

(22) Filed: Jul. 28, 2016

(65) Prior Publication Data
US 2016/0335390 A1 Nov. 17, 2016

Related U.S. Application Data

(63) Continuation of application No. 14/023,790, filed on Sep. 11, 2013, now Pat. No. 9,418,289, which is a
(Continued)

(51) Int. Cl.
*G06K 9/00* (2006.01)
*G06F 17/50* (2006.01)
(Continued)

(52) U.S. Cl.
CPC ...... *G06F 17/5081* (2013.01); *G03F 7/70616* (2013.01); *G06K 9/0055* (2013.01);
(Continued)

(58) Field of Classification Search
CPC .......... G06K 9/00496; G06K 9/00503; G06K 9/00516; G06K 9/00523; G06K 9/36;
(Continued)

(56) References Cited

U.S. PATENT DOCUMENTS

| | | | |
|---|---|---|---|
| 5,240,866 A * | 8/1993 | Friedman | H01L 22/20 257/E21.525 |
| 6,507,800 B1 * | 1/2003 | Sheu | H01L 22/20 257/E21.525 |

(Continued)

OTHER PUBLICATIONS

Chen, Y., et al. An Automated and Fast OPC Algorithm for OPC-Aware Layout Design, 2007 IEEE. Proceedings of the 8th International Symposium on Quality Electronic Design (ISQED'07), IEEE Computer Society. Mar. 28, 2007. (6 pgs.).

(Continued)

*Primary Examiner* — Eric Rush
(74) *Attorney, Agent, or Firm* — Tutunjain & Bitetto, P.C.; Daniel P. Morris

(57) ABSTRACT

A system and method for restricting the number of layout patterns by pattern identification, matching and classification, includes decomposing the pattern windows into a low frequency component and a high frequency component using a wavelet analysis for an integrated circuit layout having a plurality of pattern windows. Using the low frequency component as an approximation, a plurality of moments is computed for each pattern window. The pattern windows are classified using a distance computation for respective moments of the pattern windows by comparing the distance computation to an error value to determine similarities between the pattern windows.

18 Claims, 8 Drawing Sheets

Related U.S. Application Data continuation of application No. 13/675,537, filed on Nov. 13, 2012, now abandoned, which is a continuation of application No. 12/370,102, filed on Feb. 12, 2009, now Pat. No. 8,363,922.

(51) Int. Cl.

| | | |
|---|---|---|
| *G06K 9/46* | (2006.01) | |
| *G06K 9/62* | (2006.01) | |
| *G06T 7/00* | (2017.01) | |
| *G06K 9/52* | (2006.01) | |
| *G06T 7/66* | (2017.01) | |
| *G03F 7/20* | (2006.01) | |

(52) U.S. Cl.
CPC ..... *G06K 9/00476* (2013.01); *G06K 9/00516* (2013.01); *G06K 9/4614* (2013.01); *G06K 9/525* (2013.01); *G06K 9/527* (2013.01); *G06K 9/6215* (2013.01); *G06T 7/0004* (2013.01); *G06T 7/66* (2017.01)

(58) Field of Classification Search
CPC .......... G06K 9/46; G06K 9/4614; G06K 9/52; G06K 9/522; G06K 9/525; G06K 9/527; G06K 9/6201; G06K 9/6212; G06K 9/6215; G06K 9/6255; G06K 2009/6213; G06T 7/0004; G06T 7/10; G06T 7/11; G06T 7/60; G06T 7/66; G01N 21/956; H01L 22/10; H01L 22/12; G03F 7/70616; G03F 7/7065
USPC ....... 382/144, 145, 147–149, 159, 181, 190, 382/191, 224, 260, 276; 716/51, 52
See application file for complete search history.

(56) References Cited

U.S. PATENT DOCUMENTS

| | | | | |
|---|---|---|---|---|
| 6,630,996 | B2* | 10/2003 | Rao | G01N 21/9501 356/237.1 |
| 7,220,990 | B2* | 5/2007 | Aghababazadeh | G01R 31/2831 257/48 |
| 7,533,313 | B1* | 5/2009 | Retersdorf | G01R 31/2894 702/1 |
| 7,715,597 | B2* | 5/2010 | Costache | G06F 17/30259 382/118 |
| 7,796,803 | B2* | 9/2010 | Oaki | G06T 7/001 382/144 |
| 8,131,066 | B2* | 3/2012 | Hua | G06F 17/3025 382/160 |
| 8,191,018 | B1* | 5/2012 | Molesa | G06F 17/50 382/141 |
| 8,331,651 | B2* | 12/2012 | Nishiura | G06K 9/6255 382/149 |
| 2002/0054694 | A1* | 5/2002 | Vachtsevanos | G06T 7/0006 382/111 |
| 2002/0161763 | A1* | 10/2002 | Ye | G06F 21/55 |
| 2005/0273734 | A1* | 12/2005 | Kamat | G06F 17/5068 716/51 |
| 2006/0159330 | A1* | 7/2006 | Sakai | G06T 7/001 382/141 |
| 2006/0182335 | A1* | 8/2006 | Levin | G01N 21/9501 382/154 |
| 2006/0190875 | A1* | 8/2006 | Arisawa | G03F 1/84 716/52 |
| 2007/0053580 | A1* | 3/2007 | Ishikawa | G06T 7/001 382/149 |
| 2007/0133855 | A1* | 6/2007 | Kataoka | G06K 9/6251 382/133 |
| 2007/0189608 | A1* | 8/2007 | Shi | G06T 1/005 382/224 |
| 2007/0286497 | A1* | 12/2007 | Podilchuk | G06K 9/6206 382/218 |
| 2008/0141195 | A1* | 6/2008 | Torres Robles | G06F 17/5081 716/52 |
| 2008/0253665 | A1* | 10/2008 | Mitarai | G06K 9/6252 382/227 |

OTHER PUBLICATIONS

DeMaris, D., et al. An Information Retrieval System for the Analysis of Systematic Defects in VLSI. 16th IEEE International Conference on Tools with Artificial Intelligence (ICTAI'04). 2004. (8 pgs.).

Do, M., et al. Invariant Image Retrieval Using Wavelet Maxima Moment. Swiss Federal Institute of Technology, Lausanne Laboratory for Audio-Visual Communications. Lecture Notes in Computer Science vol. 1614/1999. Jun. 1998. (46 pgs.).

Gennari, F., et al. A Pattern Matching System for Linking TCAD and EDA. 2004 IEEE. 5th International Symposium on Quality Electronic Design (ISQED'04). IEEE Computer Society. Mar. 2004. (6 pgs.).

Kahng, A., et al. Fast Dual Graph Based Hotspot Detection. Proc. 27th BACUS Symposium on Photomask Technology and Management, 6281-04. Jan. 2006 (8 pgs.).

Ma, X., et al. Generalized Inverse Lithogrpahy Methods for Phase-Shifting Mask Design. Optics Express 15066 vol. 15, No. 23. Nov. 12, 2007. (14 pgs.).

Niewczas, M., et al. An Algorithm for Determining Repetitive Patterns in Very Large IC Layouts. IEEE Transactions on Computer-Added Design of Integrated Circuits end Systems, vol. 18, No. 4. Apr. 1999. pp. 494-501. (8 pgs.).

Tang, X., et al. Technology Migration Techniques for Simplified Layouts With Restrictive Design Rules, Computer-Alded Design, 2008, ICCAD apos;06. IEEE/ACM International Conference, Nov. 2006. pp. 655-660. (6 pgs.).

Yao, H., et al. Efficient Process-Hotspot Detection Using Range Pattern Matching. Proceedings of the 2006 IEEE/ACM International Conference on Computer-Aided Design. Nov. 2006, pp. 625-632. (8 pgs.).

* cited by examiner

IC LAYOUT PATTERN MATCHING AND CLASSIFICATION SYSTEM AND METHOD

BACKGROUND

Technical Field

The present invention relates to pattern recognition and more particularly to systems and methods for recognizing and restricting lithographical patterns for integrated circuits.

Description of the Related Art

With shrinking features sizes (technology nodes), the number of integrated circuit (IC) layout patterns printed within a photon radius increases. This has multiple effects on printability quality of the patterns on a wafer, and in effect in the yield of the chips manufactured. High yield is a definitive requirement for a financially viable chip manufacturing process. A strategy to address this limiting yield problem is to restrict the number of allowed layout patterns to the ones with increased probability of printability success. For example, it is expected that in a 22 nm technology node, the number of possible patterns will be in the order of $10^{24}$. The number of allowed patterns is expected to be in the order of $10^6$.

A major step in this direction is the identification of those patterns. To accomplish this, one needs to have pattern identification, matching and classification algorithms that can respectively identify all different patterns of a specific size, match them to existing ones and finally classify them into similarity classes according to specific criteria. The classification will finally reveal the minimal set of patterns for the inclusion in the 22 nm technology node.

In the area of lithography, pattern matching has been used for other applications, e.g., OPC (optical proximity check), and hotspot detection. However, these algorithms are not sufficient to cover the needs of the present problem. In particular, there are two prior solutions, namely the L3GO and the Walsh approaches. L3GO uses geometric structures, called glyphs, to describe patterns and then uses graph techniques to map similar patterns. One of the major limitations of this approach is that it requires prior knowledge of the pattern, so pattern identification is not possible. Also, it is very tedious to describe a pattern, limiting its applicability and scaling. Finally, it does not enable projecting the patterns into a 2D space which eases classification.

The Walsh approach uses Walsh filters to decompose an image. It then uses the coefficients of the decomposition to map the pattern into a 2D space and a k-means distance metric to classify them. The number of the Walsh coefficients depends on the window size. For a 4 by 4 pixels window, we have 16 coefficients. As we scale down in technology, the window sizes increase significantly and thus the Walsh approach faces scaling limitations.

A different approach uses aberrations (the inverse Fourier transform of the optical path difference function) of patterns and does exact match pattern matching (correlations) to identify hot-spots. This approach is proven to be very fast, but reaches limitations when the window sizes increase. In addition, due to the fact that it does exact match, it faces the same restrictions as with L3GO. Other approaches use graph theory, similar to L3GO, to identify hot-spots and thus have similar limitations.

Another approach splits the patterns into vertices and edges and defines contour signatures. Based on these, it classifies the patterns into contour equivalence classes. This again is a very different approach and suffers from problems with scaling.

Wavelets have been used widely in image and video processing for pattern matching. In lithography, wavelets have been used in mask design and OPC. In another approach, they define a wavelet penalty function to minimize the mask complexity. In this approach, they split the patterns into segments and apply Bessel-like wavelets, get the decomposition coefficients to use them as parameters in the least square metric they define to correct the patterns. Other approaches use wavelet edge moments to define an image signature and then uses the Euclidean distance metric to retrieve similar images from a database. This approach uses the cubic wavelet and a variable number of wavelet maxima moments (moments of edges of images). These approaches suffer from scalability issues and complexity issues.

SUMMARY

A system and method for pattern number restriction includes pattern identification, pattern matching and classification. Pattern identification includes decomposing the pattern windows into a low frequency component and a high frequency component using a wavelet analysis for an integrated circuit layout having a plurality of pattern windows. Using the low frequency component as an approximation, a plurality of moments is computed for each pattern window. The pattern windows are classified using a distance computation for respective moments of the pattern windows by comparing the distance computation to an error value to determine similarities between the pattern windows.

A method for pattern classification includes providing an integrated circuit layout having a plurality of pattern windows; decomposing the pattern windows into a low frequency component and a high frequency component using a wavelet analysis; computing a plurality of moments for each pattern window using the low frequency component as an approximation; classifying the pattern windows into pattern classes using a distance computation for respective moments of the pattern windows by comparing the distance computation to an error value to determine similarities between the pattern windows; and determining a permissible set of patterns usable for a given technology node based on the pattern classes of pattern windows. An integrated circuit chip is configured to perform this method for classifying a set of patterns in a set of layout patterns.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
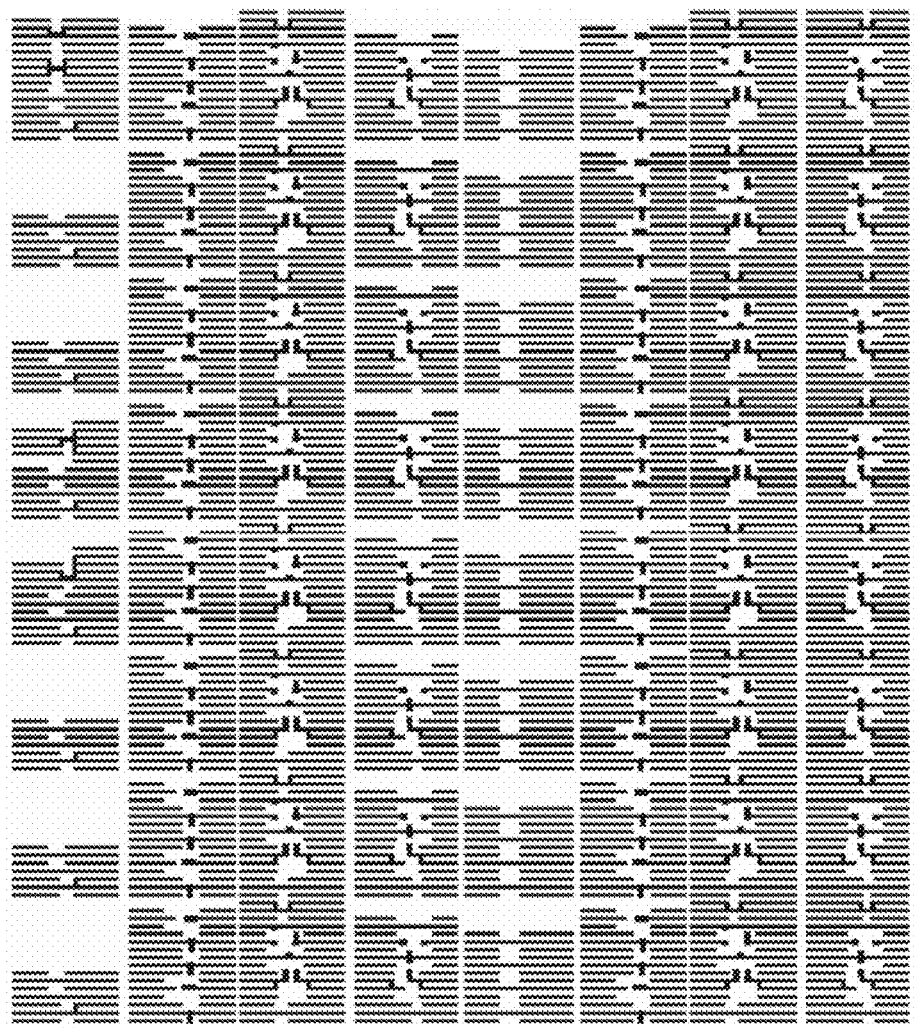
FIG. 1 is a layout of a component of an integrated circuit that can be easily visually decomposed into pattern windows in accordance with an illustrative example.

IC layout patterns range from simple to very complex geometric structures. On several occasions, however, they include small differences (such as limited affine transformations or small perturbations) of other geometric structures. It is therefore important to identify the layout patterns and classify them in similarity or equivalence classes where such affine transformation or other local perturbations are encountered. To do so, the image of the patterns is decomposed into its low and high frequency parts. The low frequency part includes the "tendency" of the pattern while the high frequency part preserves the details. The first 4 moments of the low frequency part are then calculated: the mean, the variance, the skewness and the kurtosis. These 4 values may be used to uniquely represent the tendency of the pattern. We use these 4 values in the form of a 4-tuple to map the pattern into a pattern space. We use then the Canberra distance metric to classify the patterns. Patterns that have a Canberra distance from the center of a class smaller than error e, belong to the same class.

Some of the major advantages of the present approach are summarized below. The present embodiments describe the patterns with a 4-tuple and thus can be used for all, pattern identification, matching and classification. The wavelets used are preferably the simplest and can be very easily and rapidly implemented. Similarly, the 4-tuples are based on moments that are fast to compute and need only a small amount of storage resources. The present embodiments decompose the image into its low and high frequency parts and use the low frequency "tendency" part for further analysis, so it encompasses small perturbations within the same class. Also, the moments can be made affine-transform invariant so within a class, we can reduce significantly the search in the pattern space. The present embodiments may employ the Canberra metric which has been proven to act robustly in very large numbers when the L2 and Euclidean distance metrics fail.

Embodiments of the present invention can take the form of an entirely hardware embodiment, an entirely software embodiment or an embodiment including both hardware and software elements. In a preferred embodiment, the present invention may be implemented in software, which includes but is not limited to firmware, resident software, microcode, etc.

Furthermore, the invention can take the form of a computer program product accessible from a computer-usable or computer-readable medium providing program code for use by or in connection with a computer or any instruction execution system. For the purposes of this description, a computer-usable or computer readable medium can be any apparatus that may include, store, communicate, propagate, or transport the program for use by or in connection with the instruction execution system, apparatus, or device. The medium can be an electronic, magnetic, optical, electromagnetic, infrared, or semiconductor system (or apparatus or device). Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code may include at least one processor coupled directly or indirectly to memory elements through a system bus. The memory elements can include local memory employed during actual execution of the program code, bulk storage, and cache memories which provide temporary storage of at least some program code to reduce the number of times code is retrieved from bulk storage during execution. Input/output or I/O devices (including but not limited to keyboards, displays, pointing devices, etc.) may be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

The circuit as described herein may be part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., Graphic Data System II (GDSII)) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Figure 2:
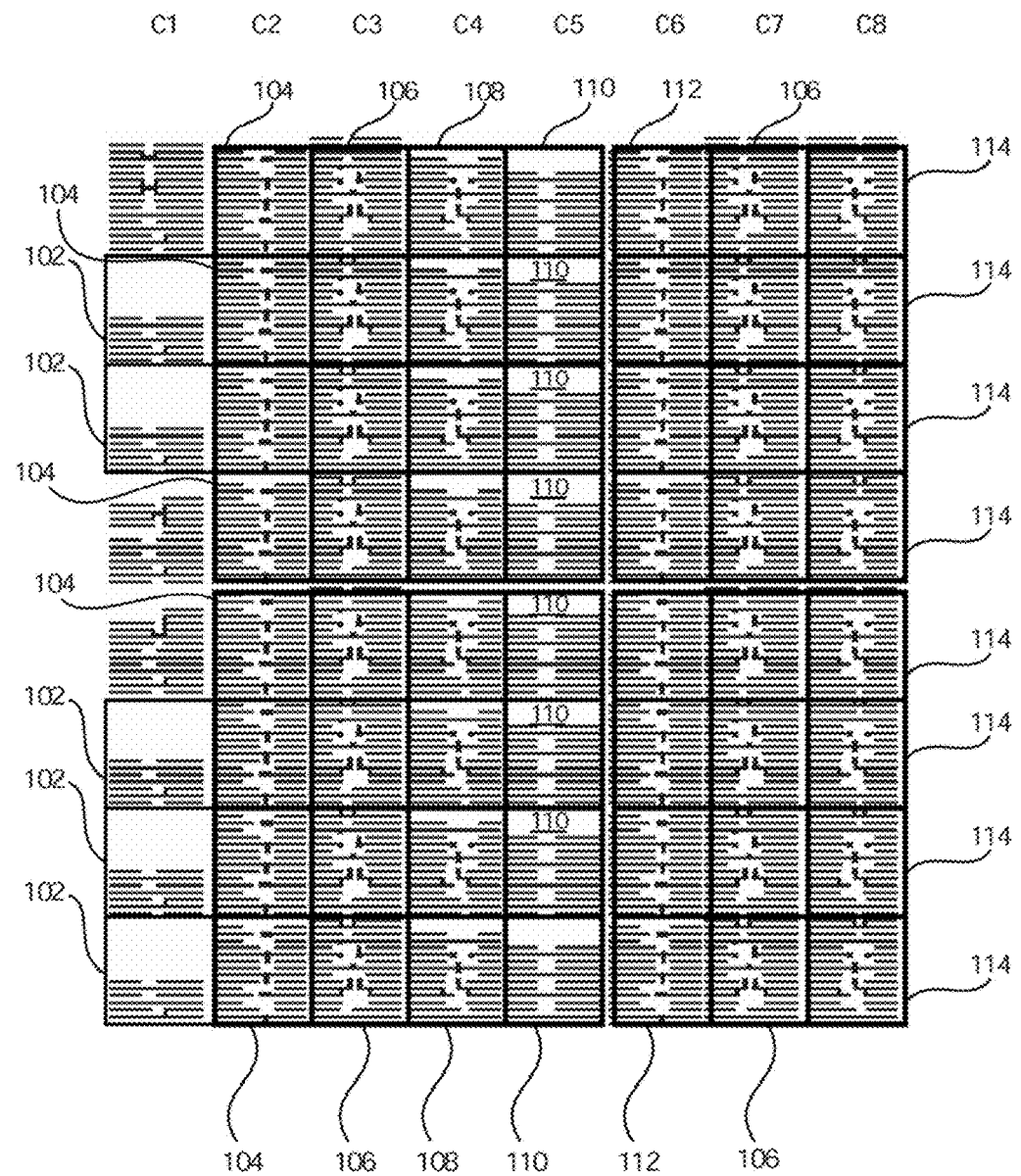
FIG. 2 is the layout of the component of the integrated circuit of FIG. 1 comprised of pattern windows grouped or classified by eye to demonstrate the effectiveness of the present embodiments.

Referring now to the drawings in which like numerals represent the same or similar elements and initially to FIG. 1, a description of an illustrative embodiment with an example is provided. Let us consider a circuit layout 100. A close analysis by eye of the layout 100 indicates that there are several patterns that are the same. The similar patterns are depicted with boxes with a same numeric label in FIG. 2. The similar patterns include patterns 102, patterns 104, patterns 106, patterns 108, patterns 110, patterns 112, and patterns 114. Note that in FIG. 2 all the patterns in columns C2, C3, C4, C5, C6, C7 and C8 are the same respectively as patterns 104, 106, 108, 110, 112, 114. The size of the patterns is illustratively 136×360 pixels. These are very big windows to use in the Walsh or other approaches. It should be understood that the patterns may be laid out in a lithographic mask, patterned on a substrate, displayed or imaged electronically or rendered in hardware.

The present approach decomposes the image into its low frequency and high frequency parts using Haar wavelets. A wavelet may be defined by a scaling filter, e.g., a low-pass finite impulse response (FIR) filter of a given length and sum or defined by a wavelet function $\psi(t)$ and a scaling function $\varphi(t)$ in the time domain. The wavelet function is in effect a band-pass filter and scaling it for each level halves its bandwidth. The scaling function filters the lowest level of the transform and ensures all of a spectrum is covered. For a wavelet with compact support, $\varphi(t)$ can be considered finite in length and is equivalent to a scaling filter.

The Haar wavelet is a sequence of functions. The Haar wavelet's wavelet function $\psi(t)$ can be described in one example as, e.g., $$\psi(t) = \begin{cases} 1 & 0 \le t < 1/2 \\ -1 & 1/2 \le t < 1 \\ 0 & \text{Otherwise} \end{cases}$$

and its scaling function $\varphi(t)$ can be described as $$\varphi(t) = \begin{cases} 1 & 0 \le t < 1 \\ 0 & \text{Otherwise} \end{cases}.$$

The decomposition of the image into its low frequency and high frequency parts using Haar wavelets is performed by a 2D Discrete Haar Transform (DHT). The 2D DHT is composed of a tensor product of 1D DHTs. DHT transformation is known. A number of decomposition levels is chosen, and this is the number of times the DHT will be applied to the low-pass filter component.

Then, for each window of an approximation, we calculate a number of moments. In one embodiment, the following 4 moments are computed: the mean, the variance, the skewness and kurtosis in both x and y dimensions, resulting into a 4-tuple vector. To illustrate the effectiveness of the moments' calculations, we use FIG. 3.

Figure 3:
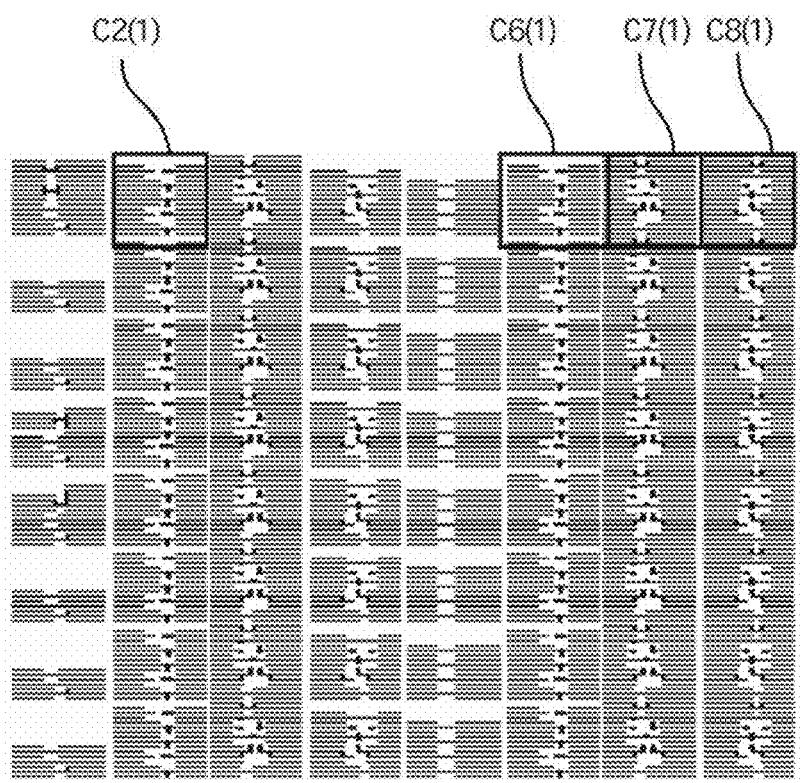
FIG. 3 is the layout of the integrated circuit of FIG. 1 comprised of pattern windows having four window patterns selected for analysis in accordance with one embodiment.
Figure 4:
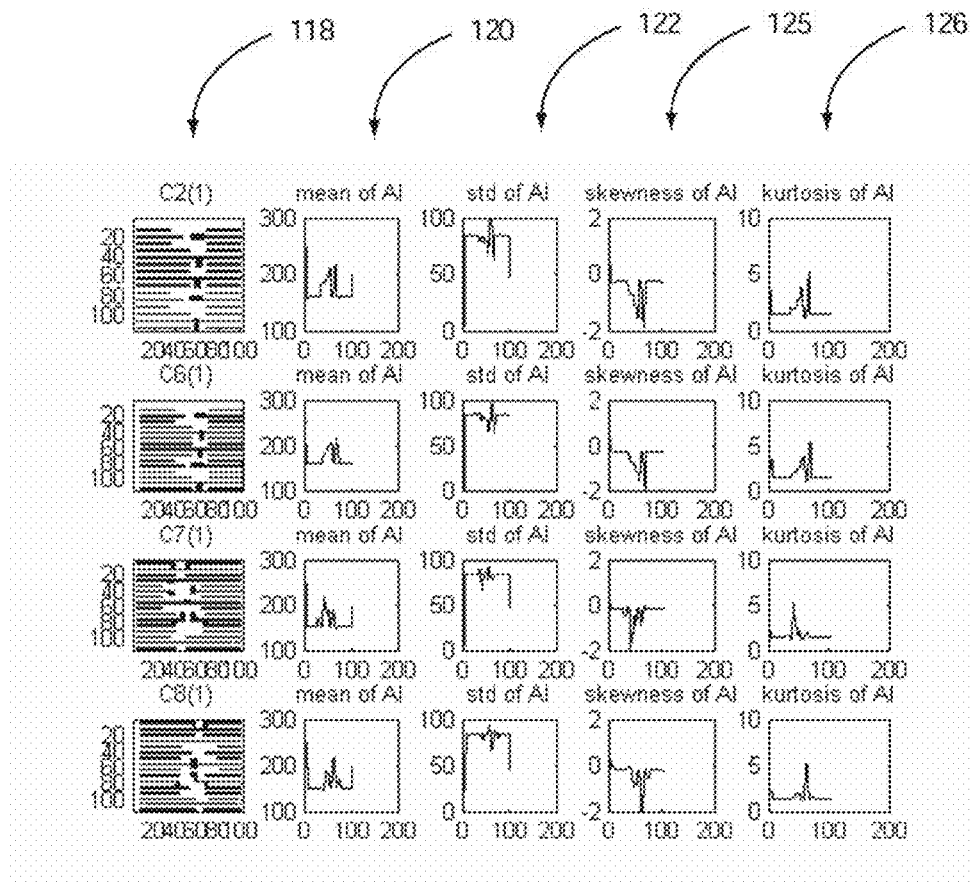
FIG. 4 shows an approximation of the patterns selected in FIG. 3 and their corresponding computation of four moments of a low frequency component of their wavelet decomposition for each pattern window in accordance with the present principles.

Referring to FIG. 3, we select 4 illustrative windows, namely C2(1), C6(1), C7(1) and C8(1). Windows C2(1) and C6(1) are exactly the same while window C8(1) includes window C7(1) plus some additional buffers. In FIG. 4, we draw the 4 moments over only the x axis per window 118, so it is clear that the similarity of the moments exists for the similar windows. For example, a plot of the mean 120, standard deviation 122, skewness 124 and kurtosis 126 show similarities for C2(1) and C6(1) and differences for C7(1) and C8(1). Once we have the 4-tuples (120-126) per window (118), we classify the windows 118 by using the Canberra distance metric: $D(x,y)=(1/n) \boxtimes |x_i-y_i|/(|x_i|+|y_i|)$, where n is the number of points and x and y are the coordinates of the point i.

This distance metric D has been proven to be very powerful in classifying a huge amount of data, where the L2 or Euclidean distance metrics seem to fail. We classify the 4-tuples to belong to the same class when D<e or fall within a particular range of values for e. The error e is a parameter that may be user set or based on an error computation, based on an error tolerance measure, based on technology or based on any other criteria suitable for matching patterns.

Figure 5:
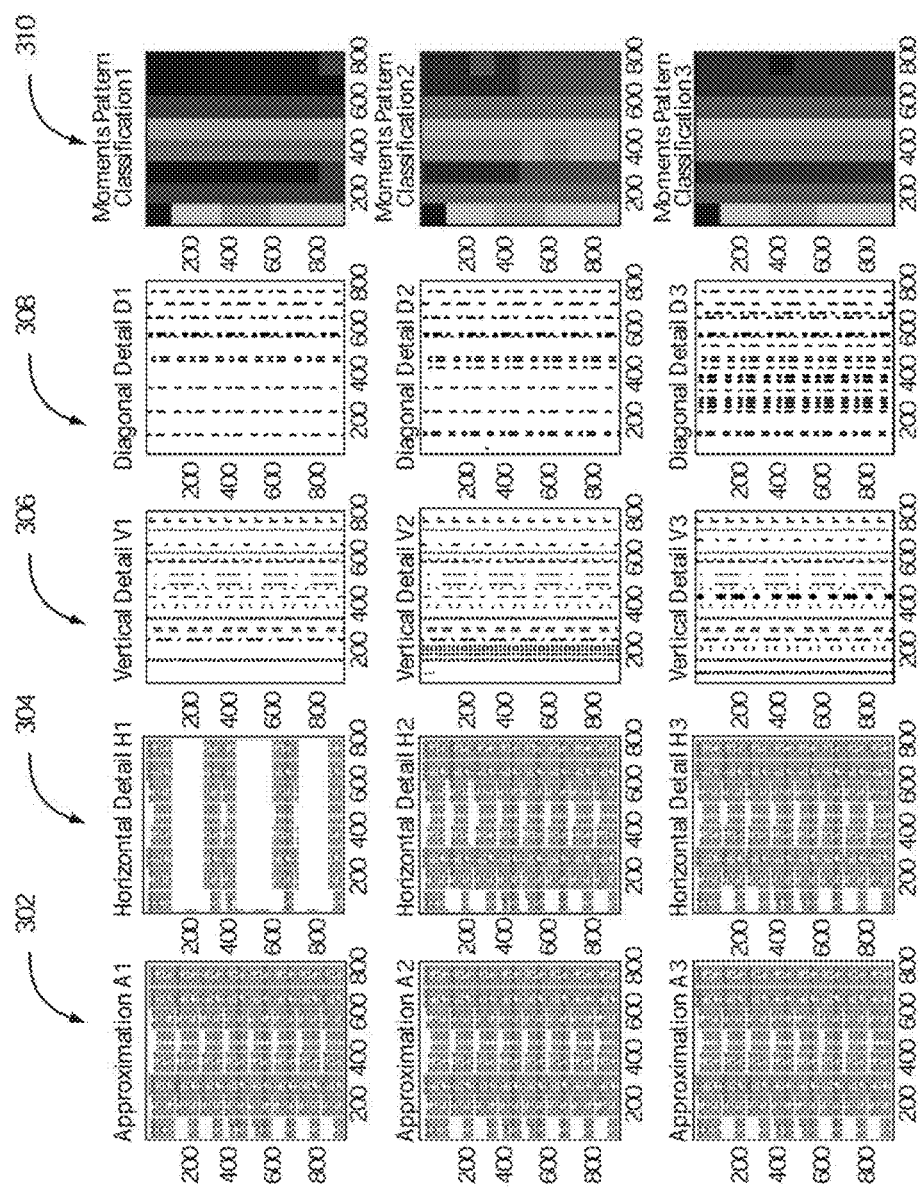
FIG. 5 shows three levels of decomposition of the layout, including per level the low frequency component-based approximation component, the corresponding high frequency components evaluated in the horizontal, vertical and diagonal orientations and a moment pattern classification map for each level in accordance with the present principles.

In a particularly useful embodiment, the layout pattern windows are decomposed into the respective high frequency and low frequency components and the respective moments are calculated for a number of levels, until an optimal solution is reached. In one example, we use 3 levels as depicted in FIG. 5. In FIG. 5, we depict per row (level), an approximation in column 302 (e.g., the low frequency part of image) and the details (high frequency parts) in a horizontal, vertical and diagonal direction, respectively in columns 304, 306 and 308, and in a last column 310 matching results are depicted for the windows in the layout. For column 310, all patterns found are colored, textured or otherwise depicted to belong to a same class with the same characteristics. The final results are shown in FIG. 6.

Figure 6:
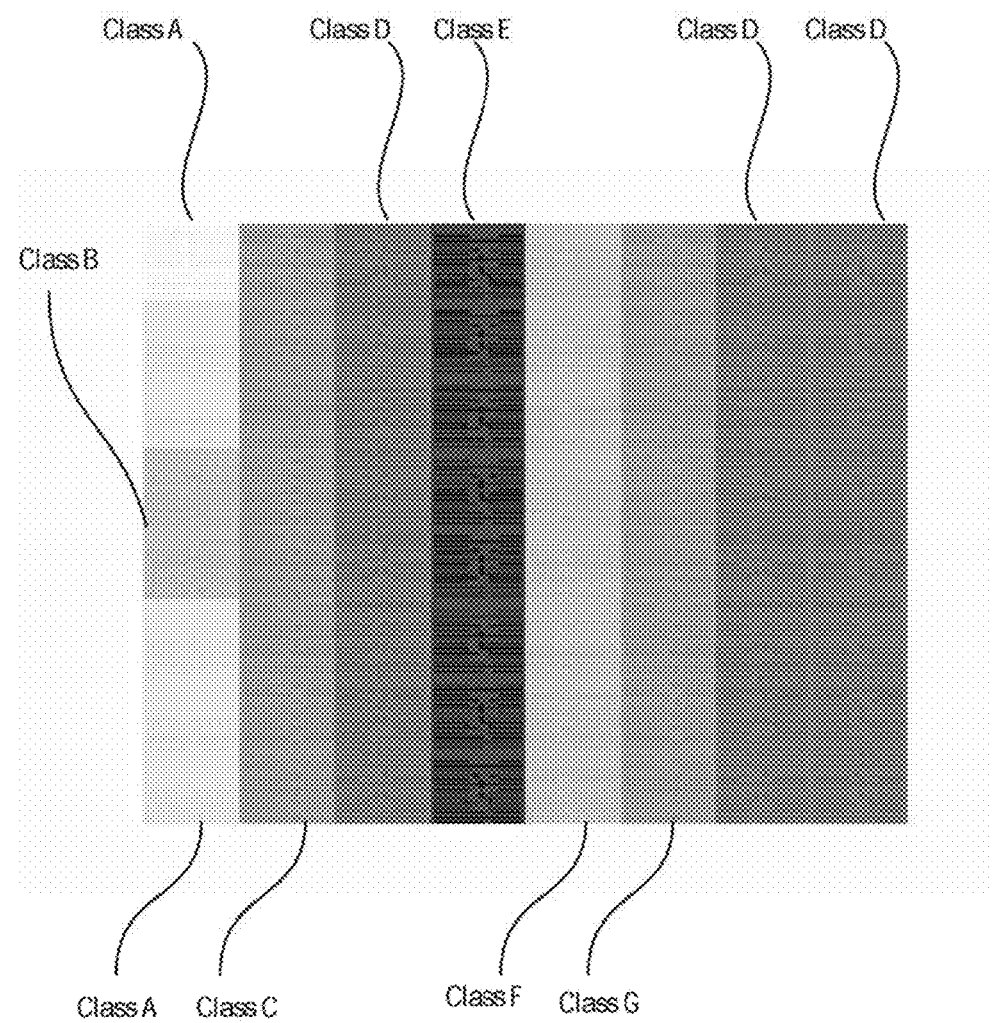
FIG. 6 is a classification map of the layout showing the final results of the classification in accordance with the present principles.

Referring to FIG. 6, the layout 100 of FIG. 1 is shown where colors with the same shade for the windows have been identified by our approach to belong to a same class. Comparing to FIG. 2, with exception of the last column, we have successfully identified and classified correctly the different patterns in the layout 100. The classes A, B, C, D, E, F and G are illustratively depicted. An error appears in the classification of the last column (column 8) which is due to the error value e selected, which is in the current implementation the same for all patterns. This discrepancy, which is shown for illustration purposes, is alleviated when the error value is refined. The last column would then be classified separately.

Figure 7:
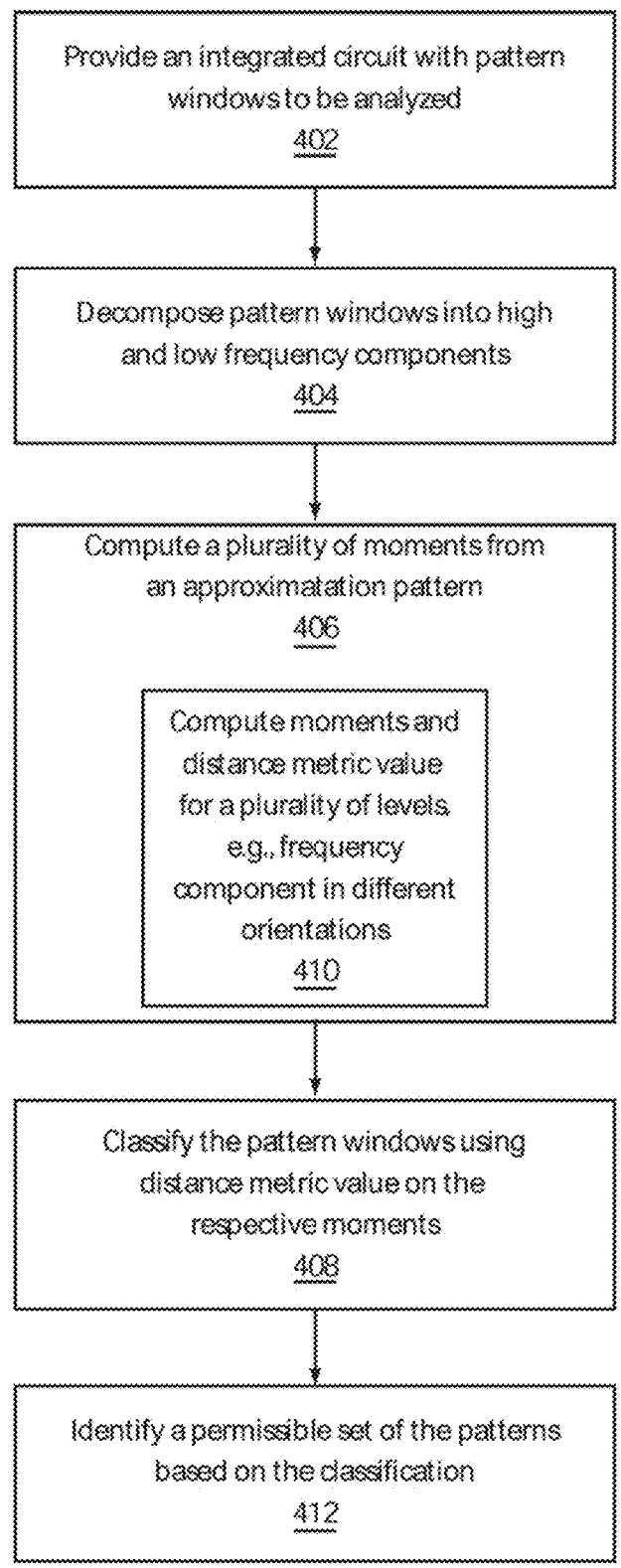
FIG. 7 is a block/flow diagram showing a system/method for identifying and classifying patterns in accordance with the present principles.

Referring to FIG. 7, a system/method for pattern identification and classification is illustratively shown. In block 402, an integrated circuit layout having a plurality of pattern windows is provided. The patterns may include integrated circuit features such as lines, devices, components etc. In block 404, the pattern windows are decomposed into at least a low frequency component (a high frequency component may also be employed) using a wavelet analysis. In one embodiment, Haar wavelets are employed to decompose the patterns into a graphical depiction that represents the pattern or patterns. This decomposition is performed by the 2D Discrete Haar Transform (DHT). The 2D DHT is composed of a tensor product of 1D DHTs. A number of decomposition levels is chosen, and this is the number of times the DHT will be applied to the low-pass filter component.

In block 406, the low frequency component is employed as an approximation for computing a plurality of moments for each pattern window. The moments computed may include one or more of a mean, a variance, a skewness and a kurtosis. Other moments or features may also be employed such as, e.g., centroids, standard deviations, correlation coefficients, etc.

In block 408, the pattern windows are classified using a distance computation (distance metric values) for respective moments of the pattern windows by comparing the distance computation to an error value to determine similarities between the pattern windows. In one embodiment, the classification of the pattern windows is performed using a Canberra metric. In block 410, the moments for a plurality of levels are computed, and a distance computation for respective moments of the pattern windows in the plurality of levels is employed for classification. The levels preferably may include the high frequency components in one or more orientations or the low frequency components in one or more orientations, or both. The orientations may include one or more of horizontal, vertical and diagonal. In block 412, the classification reveals a set of patterns for inclusion in a permissible set of patterns for a given technology node. The pattern identification, matching and classification can respectively identify all different patterns of a specific size, match them to existing ones and finally classify them into similarity classes according to specific criteria. The classification finally reveals a minimal set of patterns for the inclusion in a particular technology node, e.g., a 22 nm technology node.

Figure 8:
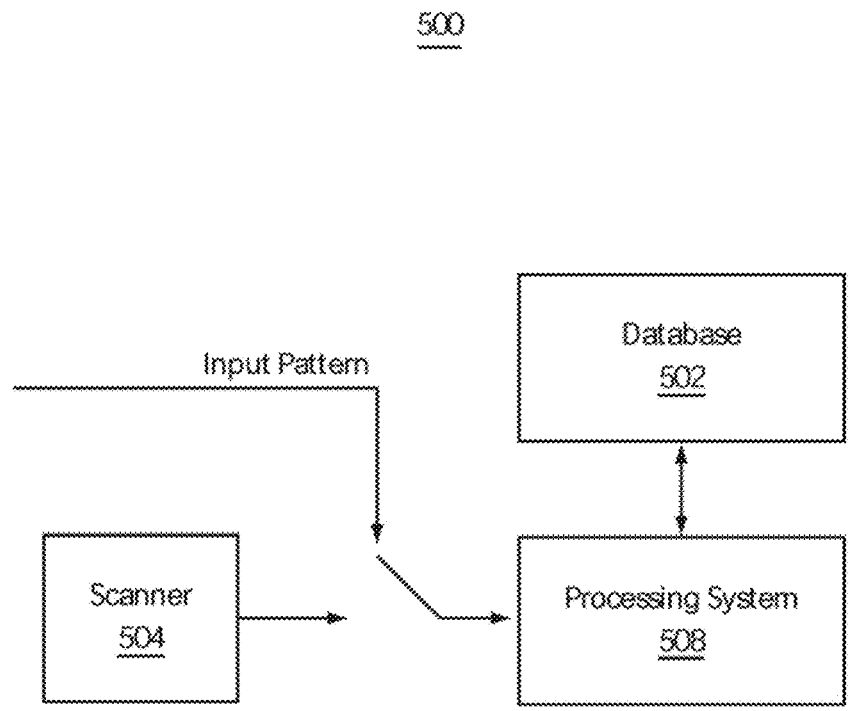
FIG. 8 is a block diagram showing a pattern identification, matching and classification system in accordance with one illustrative embodiment.

Referring to FIG. 8, a system 500 for identifying, matching and classifying patterns is illustratively shown. System 500 includes a database 502 of patterns which may include integrated circuit designs, a set of lithographic masks or any other pattern set. A scanner 504 may be employed to scan a pattern for comparison with the database 502. Alternately, the pattern may be represented virtually or otherwise input using a computer device or the like. A processing system 508 includes a processor, software and/or input and output devices to enable the decomposition of one or more patterns. The processing system 508 further provides the computation of moments as described above. A comparison is performed between the moments to permit the matching and classifying of the pattern with the patterns in the database 502.

This process results in reducing the set of layout patterns by identifying, matching and classifying the patterns into functional equivalence classes. In one embodiment, the functional equivalence class includes a set of preferred or permissible integrated circuit layout designs which may be employed for a given technology node. Other applications are also contemplated.

Having described preferred embodiments of IC layout pattern matching and classification system and method (which are intended to be illustrative and not limiting), it is noted that modifications and variations can be made by persons skilled in the art in light of the above teachings. It is therefore to be understood that changes may be made in the particular embodiments disclosed which are within the scope and spirit of the invention as outlined by the appended claims. Having thus described aspects of the invention, with the details and particularity required by the patent laws, what is claimed and desired protected by Letters Patent is set forth in the appended claims.

What is claimed is:

1. A method for classifying patterns in a set of layout patterns, comprising:
   decomposing each of a plurality of pattern windows of an integrated circuit layout into a low frequency and a high frequency component using a wavelet analysis;
   computing a plurality of moments for each of the plurality of pattern windows of the integrated circuit layout using the low frequency component as an approximation;
   classifying the plurality of pattern windows into pattern classes using a distance computation for respective moments of the plurality of pattern windows by comparing the distance computation to an error value to determine similarities between the plurality of pattern windows, the classifying including generating a preferred set of integrated circuit layout designs for a particular technology node; and
   fabricating one or more integrated circuit chips using one or more of the generated preferred set of integrated circuit layout designs.

2. The method as recited in claim 1, wherein the wavelet analysis is performed using Haar wavelets.

3. The method as recited in claim 1, wherein computing a plurality of moments for each pattern window includes computing one or more of a mean, a variance, a skewness and a kurtosis.

4. The method as recited in claim 1, wherein classifying the pattern windows using a distance computation includes classifying the pattern windows using a Canberra metric.

5. The method as recited in claim 1, further comprising computing the moments for a plurality of levels, and the step of classifying the pattern windows using a distance computation for respective moments of the pattern windows includes classifying the pattern windows using a distance computation for respective moments of the pattern windows in the plurality of levels.

6. The method as recited in claim 5, wherein the levels include frequency components in one or more orientations.

7. The method as recited in claim 6, wherein the orientations include one or more of horizontal, vertical and diagonal.

8. The method as recited in claim 1, wherein classifying reveals a set of patterns for inclusion in a permissible set of patterns for a given technology node.

9. The method as recited in claim 1, further comprising reducing the set of layout patterns by identifying, matching and classifying the patterns into functional equivalence classes.

10. A non-transitory computer readable storage medium comprising a computer readable program for classifying patterns in a set of layout patterns, wherein the computer readable program when executed on a computer causes the computer to perform steps as recited in claim 1.

11. An integrated circuit chip configured to perform a method for classifying patterns in a set of layout patterns, the method as recited in claim 1.

12. A method for classifying patterns in a set of layout patterns, comprising:
    computing a plurality of moments for each of a plurality of pattern windows of an integrated circuit layout using a low frequency component of a wavelet analysis as an approximation;
    classifying the plurality of pattern windows into pattern classes using a distance computation for respective moments of the plurality of pattern windows by comparing the distance computation to an error value to determine similarities between the plurality of pattern windows, the classifying including generating a preferred set of integrated circuit layout designs for a particular technology node; and
    fabricating one or more integrated circuit chips using one or more of the generated preferred set of integrated circuit layout designs.

13. The method as recited in claim 12, wherein the wavelet analysis includes decomposing the pattern windows using Haar wavelets.

14. The method as recited in claim 12, wherein computing a plurality of moments for each pattern window includes computing one or more of a mean, a variance, a skewness and a kurtosis.

15. The method as recited in claim 12, wherein classifying the pattern windows using a distance computation includes classifying the pattern windows using a Canberra metric.

16. The method as recited in claim 12, further comprising computing the moments for a plurality of levels, and the step of classifying the pattern windows using a distance computation for respective moments of the pattern windows includes classifying the pattern windows using a distance computation for respective moments of the pattern windows in the plurality of levels.

17. The method as recited in claim 16, wherein the levels include frequency components in one or more orientations.

18. The method as recited in claim 17, wherein the orientations include one or more of horizontal, vertical and diagonal.

* * * * *